(12) United States Patent
Ahadian et al.

(10) Patent No.: US 8,111,104 B2
(45) Date of Patent: Feb. 7, 2012

(54) BIASING METHODS AND DEVICES FOR POWER AMPLIFIERS

(75) Inventors: Joseph F. Ahadian, San Marcos, CA (US); Vikas Sharma, Elgin, IL (US); Neil Calanca, Crown Point, IN (US); Jaroslaw E. Adamski, Streamwood, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 12/657,727

(22) Filed: Jan. 25, 2010

(65) Prior Publication Data

US 2011/0181364 A1 Jul. 28, 2011

(51) Int. Cl.
*H03G 3/30* (2006.01)
(52) U.S. Cl. .................................... 330/290; 330/311
(58) Field of Classification Search .............. 330/251, 330/311, 277, 207 A
See application file for complete search history.

(56) References Cited

U.S. PATENT DOCUMENTS 7,248,120 B2 * 7/2007 Burgener et al. ............. 330/311
7,961,052 B2    6/2011 Bacon et al.

OTHER PUBLICATIONS

Maxim Integrated Products, "Charge Pumps Shine in Portable Designs", Application Note 669, Mar. 15, 2001, 16 pages.
Sokal, Nathan O., "Class E-A New Class of High Efficiency Tuned Single-Ended Switching Power Amplifiers", IEEE Journal of Solid-State Circuits, vol. SC-10, No. 3, Jun. 1975, pp. 168-176.
Tran, Pablo N., Notice of Allowance received from the USPTO dated May 19, 2011 for related U.S. Appl. No. 11/501,125, 11 pgs.
Choe, Henry, Office Action received from USPTO for related U.S. Appl. No. 12/657,728 dated Jun. 15, 2011, 4 pgs.
Nguyen, Hieu P., Notice of Allowance received from the USPTO dated Sep. 20, 2011 for related U.S. Appl. No. 12/590,839, 13 pgs.
Adamski, et al., Response filed in the USPTO dated Dec. 13, 2011 for related U.S. Appl. No. 13/008,711, 5 pgs.
Tran, Pablo N., Notice of Allowance received from the USPTO dated Oct. 16, 2011 for related U.S. Appl. No. 11/501,125, 11 pgs.
Choe, Henry, Notice of Allowance received from the USPTO dated Oct. 14, 2011 for related U.S. Appl. No. 12/799,910, 23 pgs.
Nguyen, Khanh V., Office Action received from the USPTO dated Nov. 14, 2011 for related U.S. Appl. No. 12/807,365, 14 pgs.

* cited by examiner

*Primary Examiner* — Hieu Nguyen
(74) *Attorney, Agent, or Firm* — Jaquez & Associates; Martin J. Jaquez, Esq.; Alessandro Steinfl, Esq.

(57) ABSTRACT

Biasing methods and devices for power amplifiers are described. The described methods and devices use the power amplifier output voltage to generate bias voltages. The bias voltages are obtained using rectifiers and voltage dividers. The described biasing methods and devices can be used with class-E power amplifiers.

48 Claims, 7 Drawing Sheets

BIASING METHODS AND DEVICES FOR POWER AMPLIFIERS

BACKGROUND

1. Field

The present teachings relate to amplifier biasing. In particular, the present teachings relate to biasing methods and devices for use in implementing power amplifiers.

2. Description of Related Art

Highly efficient microwave and RF amplifiers producing large output voltages (e.g., 14 to 16 V) are adopted for many applications. In order to be able to handle such large voltages during operation, a CMOS type power amplifier often presents devices arranged in a cascode configuration where the devices are stacked in series. The gates of the power amplifier devices used in the stack have bias voltages that are higher than the battery supply voltage. Such high voltages are usually not available in present technologies and they are provided separately.

A solution to this problem is to use charge pumps. However, using charge pumps to generate bias voltages may result in interference at charge pump frequency. Also, this solution involves design of more complex circuits. Moreover, using charge pumps increases the overall power consumption resulting in a lower power amplifier efficiency. See, for example, Charge Pumps Shine in Portable Designs, Maxim, Application Note 669 (Mar. 15, 2001), incorporated herein by reference in its entirety.

SUMMARY

According to a first aspect, a biasing method is provided, comprising the steps of: providing an amplifier having an amplifier input and an amplifier output; tapping the amplifier output to generate an AC voltage; rectifying the AC voltage to generate a rectified voltage, and dividing the rectified voltage to produce one or more bias voltages, and wherein the bias voltages are used to bias the amplifier.

According to a second aspect, a biasing method for class-E power amplifiers is provided, comprising the steps of: providing a class-E power amplifier comprising a plurality of MOSFET devices adapted to operate in an ON state or an OFF state, wherein the class-E power amplifier has an output that is coupled to a load network; generating an amplifier output voltage at the amplifier output; providing a biasing capacitance receiving the amplifier output voltage at one end and generating an AC voltage at another end; generating a resonance condition through a combination of the biasing capacitance with the load network when the plurality of MOSFET devices are in the OFF state, and rectifying the AC voltage to generate one or more bias voltages to the class-E power amplifier.

According to a third aspect, a bias circuit connectable, during operation, to a power amplifier comprising a plurality of MOSFET devices to produce a power amplifier AC output voltage at a power amplifier output is provided comprising: a rectifier, the rectifier having a rectifier DC voltage output and rectifying an AC voltage originated from the power amplifier AC output voltage to a DC voltage at the rectifier DC voltage output, the DC voltage being input, during operation, to one or more gate terminals of the MOSFET devices of the power amplifier.

According to a fourth aspect, a bias circuit connectable, during operation, to a power amplifier comprising: a plurality of MOSFET devices to produce a power amplifier AC output voltage at a power amplifier output is provided, comprising: one or more rectifiers to rectify the power amplifier AC output voltage to generate one or more bias outputs.

According to a fifth aspect, an RF power amplifier for amplifying an input signal is provided, comprising: an amplifier input; an amplifier output; a reference node; a first inductor adapted to connect the amplifier output to a power supply; a plurality of devices arranged in a cascode configuration between the amplifier output and the reference node; an output capacitor connected between the amplifier output and the reference node; an output resonant circuit comprising a second inductor connected in series with a capacitor, the output resonant circuit being connected at one end to the amplifier output and connectable at another end to a load; a bias circuit comprising: an RF voltage divider having an RF voltage divider output, the RF voltage divider being connected with the amplifier output on one side and with a shunt capacitor on another side, the shunt capacitor connecting the RF voltage divider to the reference node; a rectifier circuit having a rectifier circuit output, the rectifier circuit being connected with the RF voltage divider output on one side and with the reference node on another side; a DC voltage divider comprising a DC voltage divider first end, a DC voltage divider second end and two or more DC voltage divider outputs, wherein the DC voltage divider first end is connected to the rectifier circuit output and the DC voltage divider second end is connected to the reference node.

According to a sixth aspect, an RF power amplifier for an amplifying an input signal is provided, comprising: an amplifier input; an amplifier output; a reference node; a first inductor adapted to connect the amplifier output to a power supply; a plurality of amplifying devices arranged in a cascode configuration between the amplifier output and the reference node; an output capacitor connected between the amplifier output and the reference node; an output resonant circuit comprising a second inductor connected in series with a capacitor, the output resonant circuit being connected at one end to the amplifier output and connectable at another end to a load; a bias circuit comprising: a plurality of RF voltage dividers generating a plurality of RF voltage divider outputs; each RF voltage divider having an RF voltage divider first side and an RF voltage divider second side, the RF voltage divider first side being connected with the amplifier output and the RF voltage divider second side being connected with a shunt capacitor, the shunt capacitor connecting the plurality of the RF voltage dividers to the reference node; and a plurality of rectifier circuits generating a plurality of rectifier circuit outputs, and each rectifier circuit connecting a respective RF voltage divider output to the reference node.

Further aspects of the present disclosure are shown in the description, drawings and claims of the present application.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

In particular, biasing methods and devices for use in implementing power amplifiers in accordance with the embodiments of the present disclosure are described. More particularly, biasing methods for use in realizing class-E power amplifiers are described. Class-E amplifiers operate in "switching mode" and as such, they can achieve a much higher efficiency than do typical class-B or class-C amplifiers. See, for example, "Class E-A New Class of High-Efficiency Tuned Single-Ended Switching Power Amplifiers", Nathan O. Sokal et al. IEEE journal of Solid-State Circuits, Vol, SC-10, NO. 3, June 1975, incorporated herein by reference in its entirety. In other words, active devices used in these amplifiers operate as ON/OFF switches. A class-E amplifier further comprises a load network which shapes the voltage and current waveforms to prevent simultaneous high voltage and current levels occurring in the devices. As a result, power consumption, especially during switching transitions, is reduced.

Figure 1A:
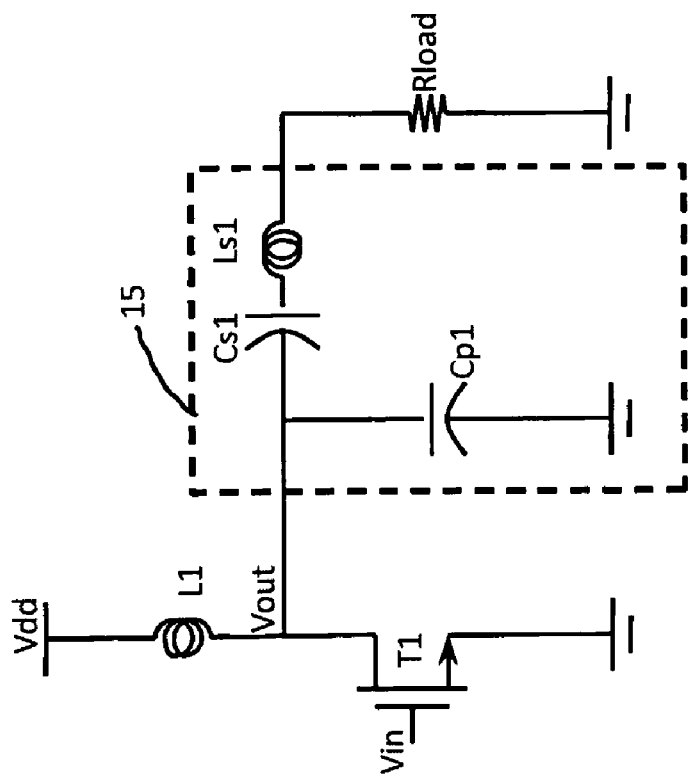
FIG. 1A shows a conventional class-E amplifier circuit.

FIG. 1A shows a typical Class-E power amplifier (10) comprising a transistor T1, a load network (15), a supply choke L1 and a load, represented by Rload. The load network (15) comprises an inductor Ls1, a parallel capacitor Cp1 and a series capacitor Cs1.

Figure 1B:
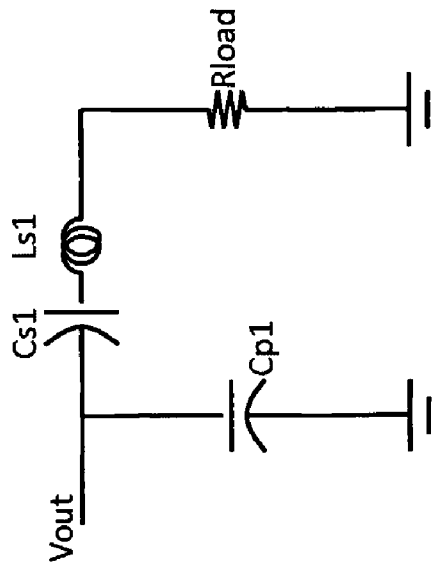
FIG. 1B shows a load network of the amplifier shown in FIG. 1A.

FIG. 1B shows an equivalent circuit (20) of the amplifier (10) when the transistor T1 of amplifier (10) operates in an OFF state. It is well known in the art that a series combination of the capacitors Cp1 and Cs1, together with the inductor Ls1 provides a resonant circuit. The resonance frequency of this resonant circuit is designed to be equal to the first harmonic of an input signal Vin that is applied to the amplifier (10).

Figure 2:
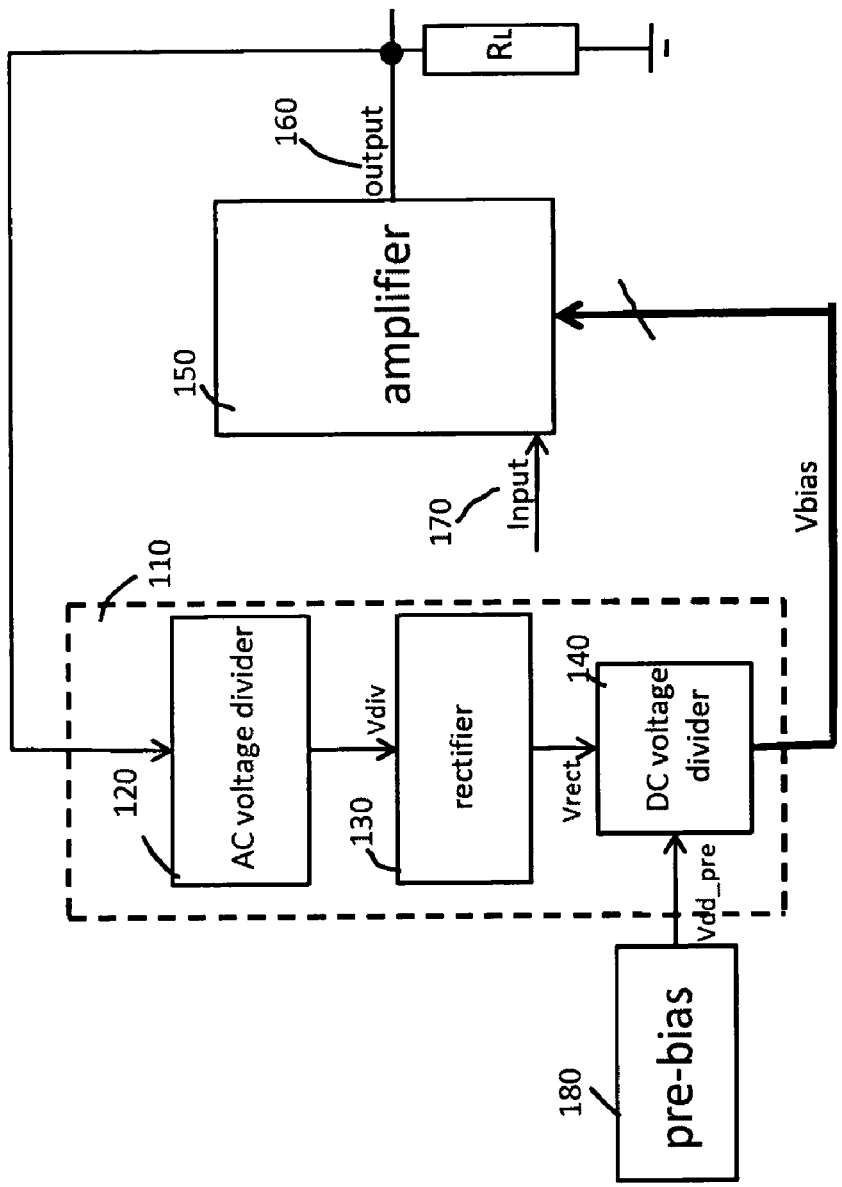
FIG. 2 shows a high level block diagram of an amplifier and biasing circuit according to an embodiment of the present teachings.

FIG. 2 shows a high level block diagram of an amplifier and biasing circuit (100) made in accordance with one embodiment of the present teachings. As shown in FIG. 2, the circuit (100) comprises an amplifier (150) and its associated biasing circuit (110). The amplifier (150) has an input (170) and an output (160). The output (160) may be coupled, in use, to a load $R_L$ (172). As shown in FIG. 2, in one embodiment, the biasing circuit (110) comprises an AC voltage divider (120), a rectifier (130) and a DC voltage divider (140).

As shown in FIG. 2, in an operative condition, the AC voltage divider (120) is fed by the amplifier output (160) (i.e., the amplifier output (160) is input to the AC voltage divider (120)) and generates an AC voltage divider output voltage Vdiv. The voltage divider output voltage Vdiv is input to the rectifier (130) and is rectified by the rectifier (130) thereby producing a rectifier DC output voltage Vrect. The rectifier DC output voltage Vrect is input to the DC voltage divider (140). The DC voltage divider (140) generates one or more bias voltages Vbias for the amplifier (150). The bias voltages Vbias are provided as inputs to the amplifier (150) as shown in FIG. 2. Embodiments of the biasing circuit (110) can be implemented without the DC voltage divider (140). In these embodiments, the rectifier DC output voltage Vrect is input directly to the amplifier (150) and used to bias the amplifier (150).

FIG. 2 also shows a pre-bias circuit (180) in accordance with an embodiment of the present disclosure. The pre-bias circuit (180) provides a pre-bias circuit DC output voltage Vdd_pre as input to the DC voltage divider (140). The pre-bias circuit (180) provides the amplifier (150) with stable bias voltages in scenarios wherein the amplifier (150) is in a transitional state due to ramp-up, or wherein the amplifier (150) has a small output voltage.

Figure 3:
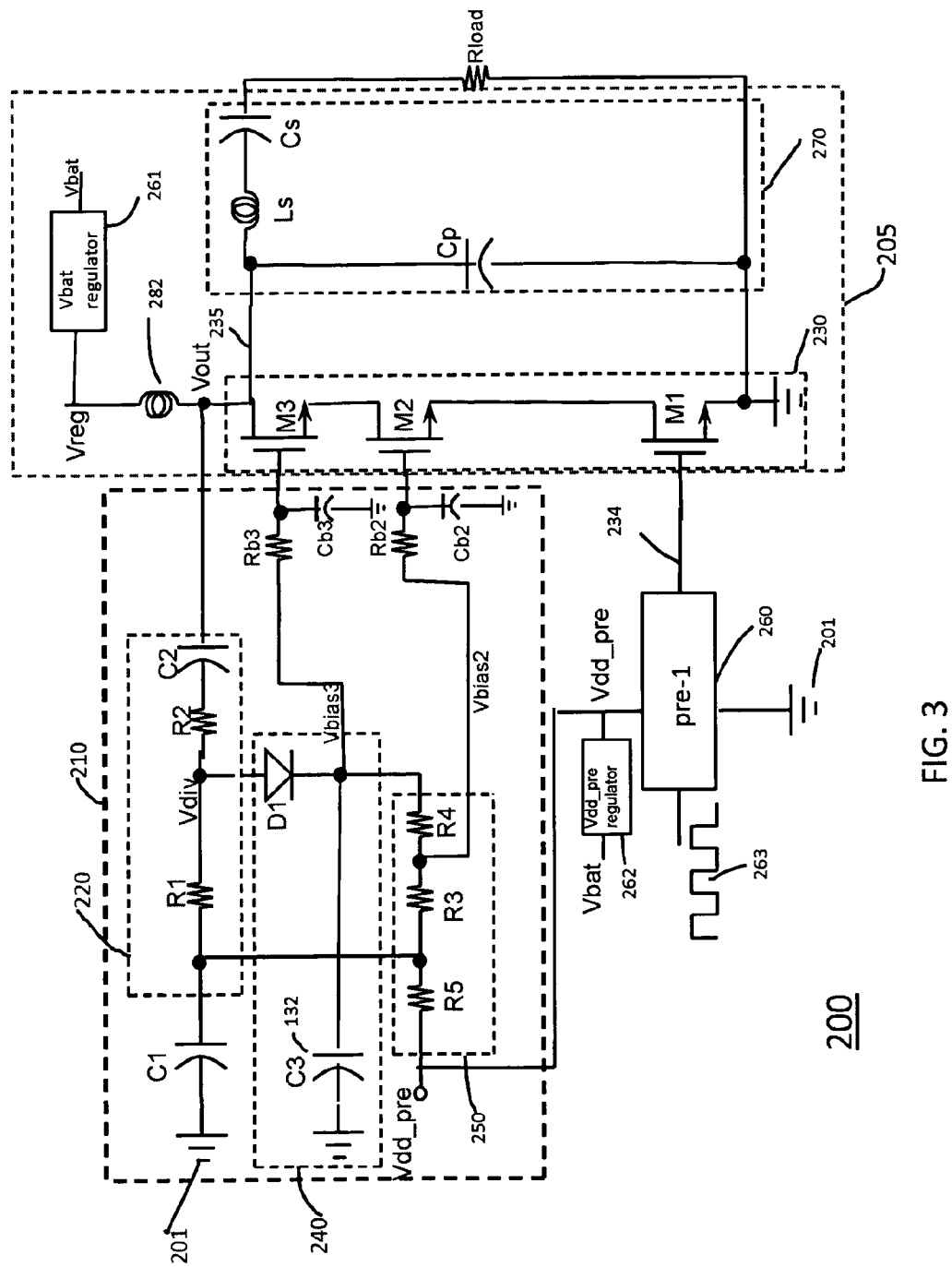
FIG. 3 is a schematic of an amplifier and bias circuit made in accordance with an embodiment of the present teachings.

FIG. 3 shows a schematic diagram of an amplifier and bias circuit (200) including a class-E power amplifier (205) made in accordance with an embodiment of the disclosure. The class-E amplifier (205) includes an amplifier input (234) and an amplifier output (235). In one exemplary embodiment, the amplifier (205) comprises a stack of MOSFET devices (230). In the exemplary embodiment, the stack of MOSFET devices (230) comprises, in turn, three MOSFET devices M1, M2 and M3, arranged in a cascode configuration. Also shown in FIG. 3, in one embodiment, an input signal (263) is input to the amplifier input (234) via a pre-amplifier "pre-1" (260). By way of example and not of limitation, the pre-amplifier (260) can be a CMOS inverter circuit.

A first voltage regulator (261) and a second voltage regulator (262) are also shown in FIG. 3. In one embodiment, the first voltage regulator (261) is included as a component of the class-E power amplifier (205) of FIG. 3. The first voltage regulator (261) and the second voltage regulator (262) use a battery voltage Vbat (or another kind of voltage) as input in order to generate, respectively, a first regulated voltage Vreg and a second regulated voltage Vdd_pre. As further shown in FIG. 3, the first regulated voltage Vreg is coupled to the amplifier output (235) through a supply choke (282).

With continued reference to FIG. 3, the amplifier output (235) is coupled to a network load (270) and to a load represented by Rload. In one exemplary embodiment of FIG. 3, the network load (270) comprises an inductor Ls, a series capacitor Cs and a parallel capacitor Cp.

In accordance with an embodiment of the disclosure, and similar to the amplifier and biasing circuit (100) of FIG. 2, the class-E power amplifier (205) is coupled to a bias circuit (210), also shown in FIG. 3. The bias circuit (210) is analogous to the biasing circuit (110) described above with reference to FIG. 2, and comprises an embodiment of an AC voltage divider (220), rectifier (240) and DC voltage divider (250), which are analogous to the AC voltage divider (120), rectifier (130), and DC voltage divider (140), respectively, described above with reference to FIG. 2. The bias circuit (210) further comprises a shunt capacitor C1 serving as an RF bypass to a reference node (201), two series bias resistors Rb3 and Rb2 and two parallel bias capacitors Cb2 and Cb3 coupled together as shown in FIG. 3. The bias circuit (210) and its function are now described.

As shown in FIG. 3, the AC voltage divider (220) comprises a capacitor C2 and two resistors R1 and R2; the rectifier circuit (240) comprises a diode D1 and a capacitor C3 serving as a filter; and the DC divider circuit (250) comprises three resistors R3, R4 and R5. These components are coupled together as shown in FIG. 3.

According to one embodiment of the disclosure, in an operative condition, an RF output voltage Vout of the class-E power amplifier (205) is generated at the amplifier output (235). The bias circuit (210) inputs the RF output voltage Vout in order to produce bias voltages for use by the devices used in implementing the MOSFET stack (230).

As shown in FIG. 3, the RF output voltage Vout is input to the AC voltage divider (220). The AC voltage divider (220) generates an AC voltage Vdiv. The AC voltage Vdiv is rectified and filtered by the rectifier (240) to generate a bias voltage Vbias3. The bias voltage Vbias 3 is provided as input to the device M3 via the series bias resistor Rb3. The bias voltage Vbias3 is further divided by the DC voltage divider (250) to generate a bias voltage Vbias2. The bias voltage Vbias2 is input to the device M2 by way of the series bias resistor Rb2.

According to the embodiment shown in FIG. 3, in an operative condition, the drain of the device M3 experiences larger voltages than does the drain of device M2. As such, the bias voltage Vbias3 is larger than the bias voltage Vbias2. The person skilled in power amplifier design art will understand that during operation, the drain of the device M3 can experience a voltage that is larger than Vbat (e.g., 15 V). Therefore, in order to bias properly the device M3, a bias voltage that is larger than Vbat is provided to the gate of the device M3 using the embodiment described above and shown in FIG. 3.

According to an embodiment of the disclosure, the DC voltage divider circuit (250) inputs the regulated voltage Vdd_pre as shown in FIG. 3. In this way, additional bias voltages are provided to the devices M2 and M3 in scenarios where the RF output voltage Vout is not sufficiently large or when the class-E power amplifier (205) is in a ramping stage to turn on. As noted above with reference to FIG. 2, providing additional biasing through the regulated voltage Vdd_pre improves the ramping behavior of the amplifier (205) during power-up. This results in a better dynamic range for the amplifier (205). According to the embodiment shown in FIG. 3, the regulated voltage Vdd_pre is also provided as a bias voltage to the pre-amplifier (260).

Referring again to FIG. 3, in an operative condition when the class-E amplifier (205) operates in an OFF state, the stack of MOSFET devices M1, M2 and M3 (230) are all turned off. Persons skilled in the art of amplifier design will understand that, in view of an AC equivalent circuit of the embodiment shown in FIG. 3, the capacitor C2 of the AC voltage divider (220) is in a parallel configuration with the parallel capacitor Cp during the OFF state of the class-E amplifier (205) and the MOSFET stack (230). As a consequence, the capacitor Cp requires a smaller capacitance value in order to provide resonance condition for class-E amplification as compared to the capacitance value of capacitor Cp1 of the conventional amplifier (10) of FIG. 1B, where the capacitor C2 is not used. Stated another way, the capacitor C2 shown in FIG. 3 contributes not only in providing bias voltages for the stack of MOSFET devices M1, M2, and M3 (230) but also in fulfilling the class-E operation of the amplifier (205). This results in an efficient method for generating bias voltages that does not consume additional power as it would occur if the bias voltages were generated by other means such as a charge pump circuit.

Referring again to the embodiment of FIG. 3, during operation, as the power amplifier starts switching into an off state, voltage levels at the drains of the devices M2 and M3 begin to rise rapidly resulting in charging of the capacitors Cb3 and Cb2 through gate-source junction capacitances of the MOSFET devices M2 and M3. Consequently, the voltage levels presented at the gates of the MOSFET devices M2 and M3 rise above their respective average DC bias values resulting in equal Vout voltage division between devices M1, M2 and M3. According to an embodiment of the disclosure, capacitance values of the capacitors Cb3 and Cb2 are selected such that a ratio of their respective capacitance values to the gate-source junction capacitance values of their respective and associated devices M3 and M2 result in equal drain to source voltage levels across M1, M2 and M3 during the operation of the amplifier and bias circuit (200). This is especially important when the devices M1, M2, and M3 switch to an "OFF" condition and the RF output voltage Vout can momentarily reach more than three times the battery voltage Vbat. In this way, equal voltage condition across a power range of the class-E amplifier (205) is provided resulting in an improved amplifier dynamic range compared with the dynamic range of the prior art amplifiers. The RF output voltage Vout reaches a highest value when the devices M1, M2, and M3 switch to an OFF state. Equal voltage division is also preserved during transient states and when the devices M1, M2, and M3 are in ON state. When the devices M1, M2, and M3 are in an ON state, a gate to source voltages of M2 and M3 are determined by a size of the capacitors Cb2 and Cb3 and an average DC level of the bias voltages Vbias2 and Vbias3. According to an embodiment of the disclosure, these voltages are sufficient to drive M2 and M3 to a low resistance state. In the same embodiment, when M1, M2 and M3 switch to an OFF state, a same combination of the capacitors Cb2 and Cb3 with the bias voltages Vbias2 and Vbias3 result in an equal peak voltages between a drain and source of the devices M1, M2 and M3.

With further reference to FIG. 3, as described above, according to an embodiment of the disclosure, the regulated voltage Vdd_pre may be fixed or controllable (i.e., variable) in an operative condition. There are situations where the class-E power amplifier (205) must be turned off. In these scenarios, potential large leakage currents may be established through a stack of the devices M1, M2 and M3. In cases where the regulated voltage Vdd_pre is controllable, the gates of the devices M1, M2, and M3 can be pulled down to the reference node (201) and as a result, the leakage current is reduced.

Figure 4:
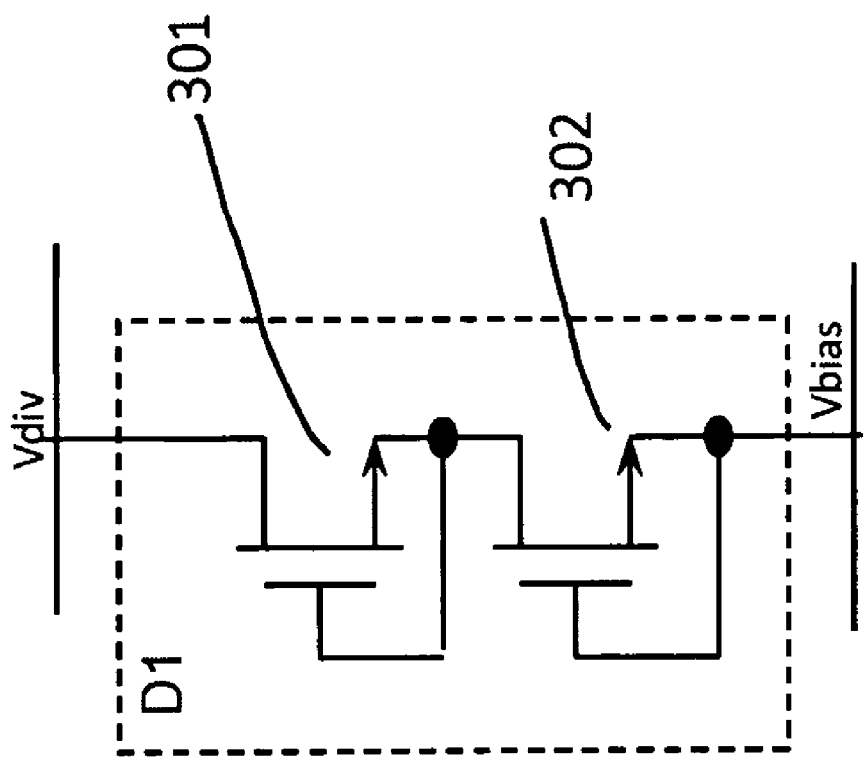
FIG. 4 shows a realization of a diode for use in the bias circuits of the present disclosure.

FIG. 4 shows an exemplary embodiment of the diode D1 described above with reference to the rectifier circuit (240) of FIG. 3, in accordance with an embodiment of the disclosure. In one embodiment, as shown in FIG. 4, the diode D1 comprises two MOSFET devices (301, 302) connected in a cascode configuration. In each MOSFET device, the gate terminal is coupled to the source terminal. According to the embodiment shown in FIG. 4, the diode D1 has a smaller forward bias voltage requirement (e.g., 10 to 20 mV) than does a conventional diode (e.g., 0.7 V). Referring again to FIG. 3, this means that the rectifier (240) may operate with smaller RF output voltage Vout levels resulting in improved dynamic range of the amplifier. Higher levels of integration require smaller devices. Smaller devices typically cannot handle large voltage levels. In a cascode configuration, and thereby stacking an increased number of devices, increased voltage stress on the devices can be avoided for a given selected range of voltage levels.

Figure 5:
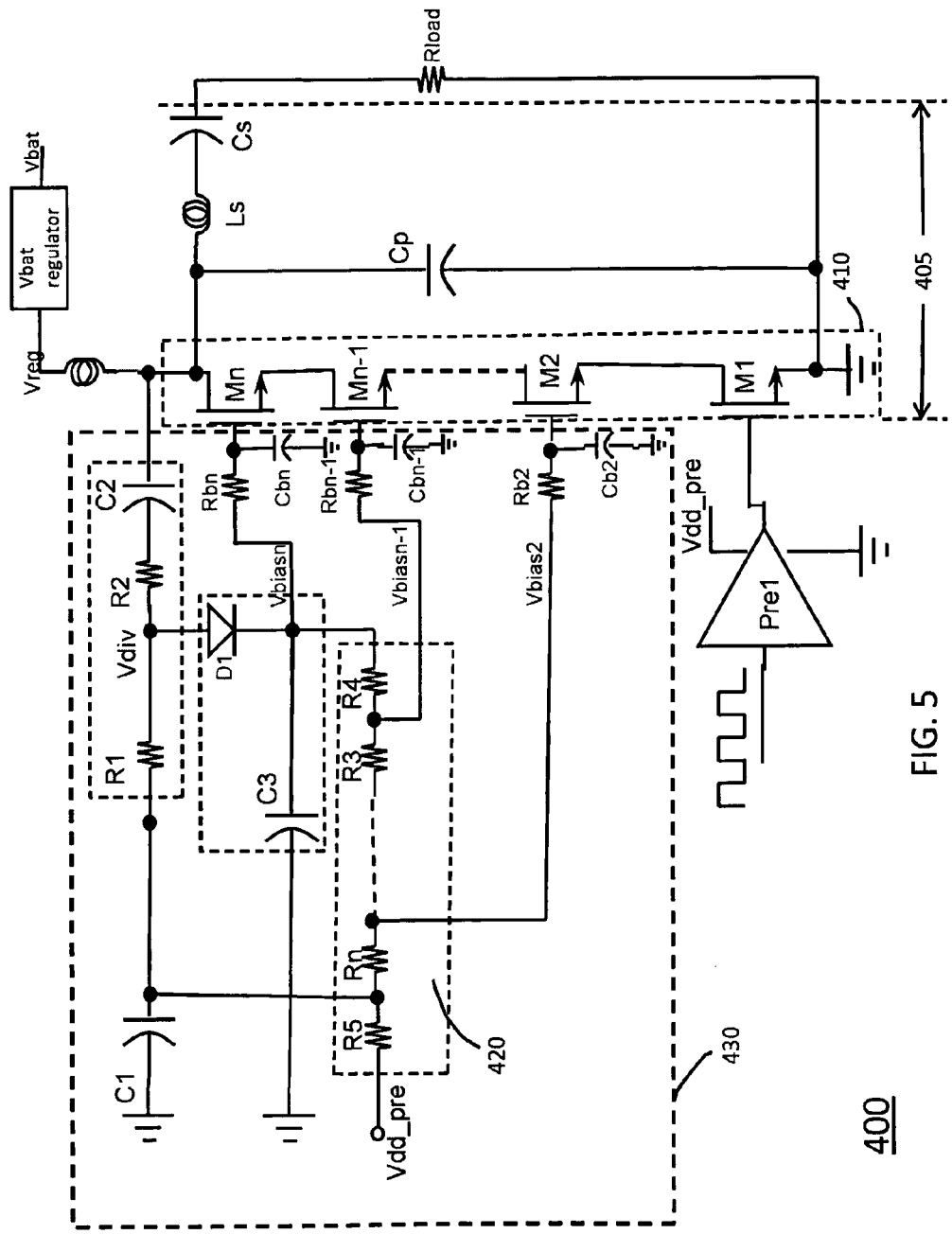
FIG. 5 shows an amplifier and bias circuit according to another embodiment of the disclosure.

FIG. 5 shows a schematic diagram of an improved amplifier and bias circuit (400) including a class-E RF amplifier (405) and bias circuit (430) made in accordance with a further embodiment of the present disclosure. The class-E RF amplifier (405) is coupled to the bias circuit (430) as shown in FIG. 5. The class-E RF amplifier (405) also includes a stack of MOSFET devices (410) as shown in FIG. 5. The stack of MOSFET devices (410) comprises a plurality of stacked MOSFET devices M1, M2, . . . , Mn−1, Mn. The bias circuit (430) comprises a DC voltage divider (420) as shown in FIG. 5. The DC voltage divider (420) comprises a plurality of resistors R3, R4, R5, . . . , Rn. The bias circuit (430) provides biasing voltages to the class-E power amplifier 405 in a manner, and function, very similar to the bias circuit 210 described above with reference to FIG. 3. In the embodiment of FIG. 5, the stack of MOSFET devices (410) comprises any convenient selected number of devices. According to the embodiment shown in FIG. 5, the DC voltage divider (420) comprises a number of resistors equal to the number of transistor devices used in implementing the stack of MOSFET devices (410). As such, a bias voltage, "Vbiasn" is generated and subsequently divided to generate a plurality of bias voltages, Vbias2, . . . Vbiasn−1, which are input, respectively, to respective and associated MOSFET devices M2, . . . , Mn−1, and through respective resistors Rb2, . . . Rbn−1, as shown. The bias voltage Vbiasn is input to the device Mn through a resistor Rbn. According to the embodiment of the amplifier and bias circuit (400) of FIG. 5, during an operative condition, the drain terminal of the device Mn experiences the largest voltage levels as compared to those presented at the other MOSFET devices of the MOSFET stack (410). As such, the largest bias voltage, i.e., the bias voltage Vbiasn, is input to the device Mn.

Figure 6:
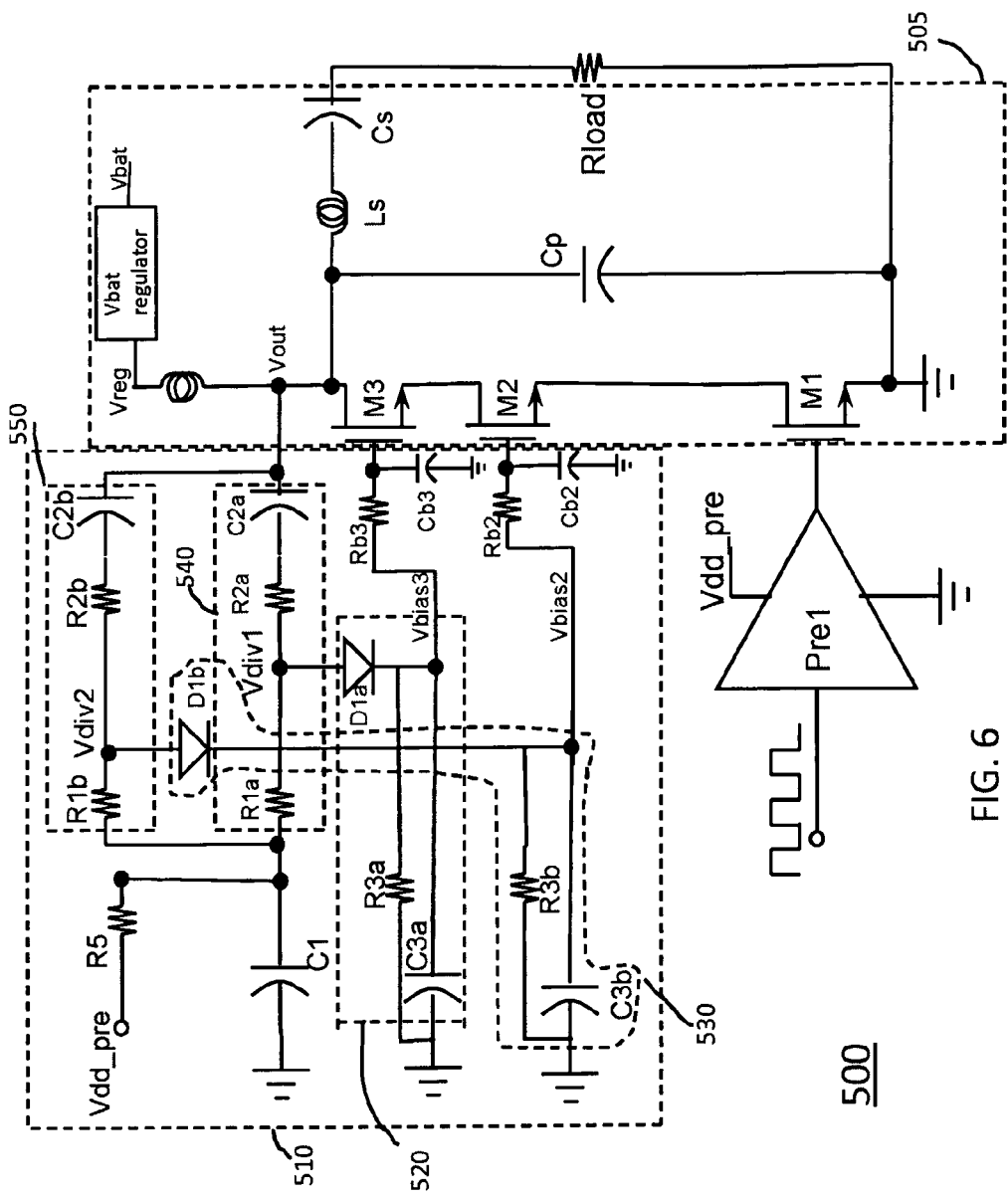
FIG. 6 shows an amplifier and bias circuit according to a further embodiment of the disclosure.

FIG. 6 shows a further embodiment of a power amplifier and bias circuit (500), including a class-E RF amplifier (505) coupled to a bias circuit (510) as shown. As shown in FIG. 6, the bias circuit (510) comprises a first AC voltage divider (540), a second AC voltage divider (550), a first rectifier (520) and a second rectifier (530). The first AC voltage divider (540) comprises a capacitor C2a, and two resistors R1a and R2a coupled together as shown. Similarly, the second voltage divider (550) comprises a capacitor C2b and two resistors R1b and R2b coupled together as shown in FIG. 6. The first rectifier (520) comprises a first diode D1a, a resistor R3a and a capacitor C3a, coupled together as shown in FIG. 6. Similarly, the second rectifier (530) comprises a second diode D1b, a resistor R3b and a capacitor C3b coupled together as shown in FIG. 6.

As shown in FIG. 6, each of the first AC voltage divider (540) and the second AC voltage divider (550) taps (i.e., receives and uses as input) the RF output voltage Vout and outputs, respectively, a first AC voltage divider output Vdiv1 (output by voltage divider (540)) and a second AC voltage divider output Vdiv2 (output by the second AC voltage divider (550)). The first AC voltage divider output Vdiv1 and the second AC voltage divider output Vdiv2 are input, respectively, to the first rectifier (520) (Vdiv1 is input to rectifier (520)) and the second rectifier (530) (Vdiv2 is input to rectifier (530)). The first rectifier (520) and the second rectifier (530) output, respectively, bias voltages Vbias3 and Vbias2. The bias voltage Vbias3 is input to the gate of the device M3 via a series bias resistor Rb3, while the bias voltage Vbias2 is input to the gate of the device M2 via a series bias resistor Rb2. In contrast to the embodiment described above with reference to FIG. 3, there is no DC voltage divider present in the embodiment of the bias circuit (510) of FIG. 6. The bias voltages Vbias3 and Vbias2 are provided, respectively, as outputs of, respectively, the first rectifier (520) (the first rectifier (520) outputs the bias voltage Vbias3) and the second rectifier (530) (the second rectifier (530) outputs the bias voltage Vbias2).

Figure 7:
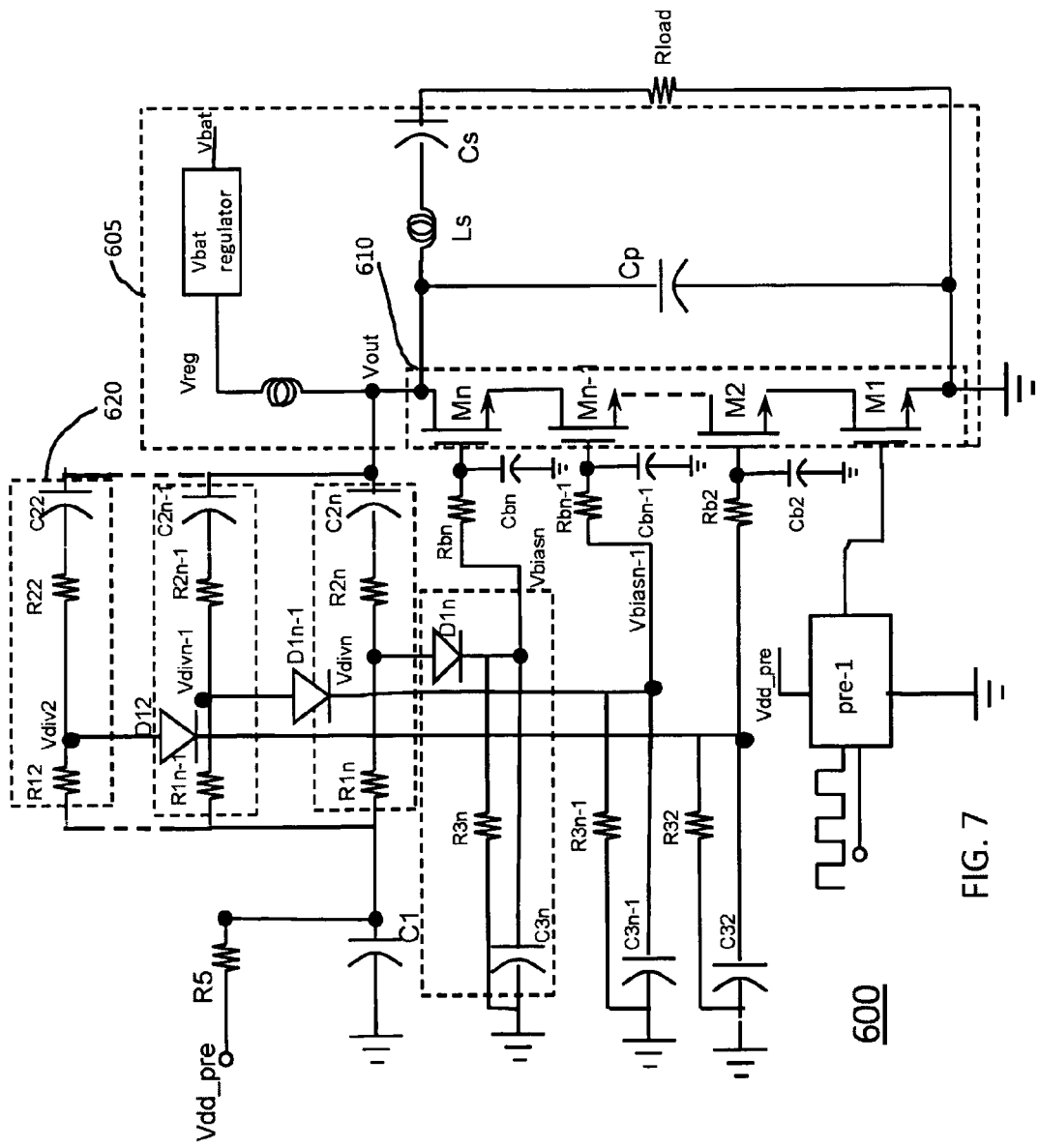
FIG. 7 shows an amplifier and bias circuit according to yet another embodiment of the disclosure.

FIG. 7 shows yet another embodiment of power amplifier and bias circuit (600) including a class-E power amplifier (605). As shown in FIG. 7, the class-E amplifier (605) comprises a stack of MOSFET devices (610). The stack of MOSFET devices (610) comprises a number "n", of MOSFET devices M1, M2, . . . , Mn.

Differently from the embodiment shown in FIG. 3 wherein only one AC voltage divider (220) was used, in the embodiment shown in FIG. 7, a number of AC voltage dividers (620) equal to the number of MOSFET devices to be biased is generated and subsequently rectified for biasing purposes. As such, in the embodiment shown in FIG. 7, distinctly from the embodiment shown in FIG. 3, no DC voltage division is performed.

Further referring to FIG. 7, n−1 AC voltage dividers (620) are coupled to the power amplifier (605). The n−1 AC voltage dividers (620) provide n−1 AC voltages, Vdiv1, Vdiv2, . . . , Vdivn feeding respectively, n−1 diodes D12, D13, . . . , D1n. The n−1 diodes D12, D13, . . . , and D1n, are combined, respectively, with capacitors C32, C33, . . . , C3n, and resistors R32, R33, . . . , R3n as shown in FIG. 7. This combination of diodes with resistors and capacitors rectify and filter their associated and respective voltages Vdiv1, Vdiv2, . . . , Vdivn to provide n−1 respective bias voltages Vbias2, Vbias3, . . . , Vbiasn. In addition, n−1 resistors Rb2, Rb3, . . . , Rbn route respectively each bias voltage Vbias2, Vbias3, . . . , and Vbiasn to respective and associated transistors M2, M3, . . . , Mn. Differently from the embodiment described above with reference to FIG. 6, the stack of MOSFET devices (610) of the embodiment 600 of FIG. 7 comprises any number of MOSFET devices. Also, any convenient selected number of AC voltage dividers and rectifiers can be used to implement the embodiment of the amplifier circuit 600 of FIG. 7.

Accordingly, what has been shown are biasing methods and devices for power amplifiers. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A biasing method comprising the steps of:
   providing an amplifier having an amplifier input and an amplifier output;
   tapping the amplifier output to generate an AC voltage;
   rectifying the AC voltage to generate a rectified voltage; and
   dividing the rectified voltage to produce one or more bias voltages to bias the amplifier,
   wherein the AC voltage is generated by using an AC voltage divider comprising an in-series arrangement of one or more resistors and one or more capacitors.

2. The biasing method of claim 1, wherein the rectified voltage is generated using a voltage rectifier comprising a diode coupled in series with a capacitor.

3. The biasing method of claim 1, wherein the one or more bias voltages are generated by a DC voltage divider comprising two or more resistors coupled together in series.

4. The biasing method of claim 1, further comprising providing a bias source to generate one or more pre-bias voltages; and wherein the bias source has a bias source DC output voltage.

5. The biasing method of claim 4, wherein the bias source DC output voltage is either fixed or variable.

6. A biasing method for class-E power amplifiers comprising the steps of:
   providing a class-E power amplifier comprising a plurality of MOSFET devices adapted operate in an ON state or an OFF state, wherein the class-E power amplifier has an output that is coupled to a load network;
   generating an amplifier output voltage at the amplifier output;
   providing a biasing capacitance receiving the amplifier output voltage at one end and generating an AC voltage at another end;
   generating a resonance condition through a combination of the biasing capacitance with the load network when the plurality of MOSFET devices are in the OFF state, and
   rectifying the AC voltage to generate one or more bias voltages to the class-E power amplifier.

7. The biasing method of claim 6, wherein the load network comprises a parallel capacitance, a series capacitance and a series inductance.

8. The biasing method of claim 7, wherein the resonance condition is generated through parallel connection between the biasing capacitance and the parallel capacitance when the plurality of the MOSFET devices are in the OFF state.

9. The biasing method of claim 6, wherein in the AC voltage is obtained with an AC voltage divider comprising an in-series arrangement of one or more resistors and the biasing capacitor.

10. The biasing method of claim 6, wherein in the AC voltage is rectified with a voltage rectifier comprising a diode in series with a capacitor.

11. The biasing method of claim 6, wherein the one or more bias voltages are produced with a DC voltage divider comprising two or more resistors in series.

12. The biasing method of claim 6, further comprising providing a bias source to generate one or more pre-bias voltages; the bias source having a bias source DC output voltage.

13. The biasing method of claim 12, wherein the bias source DC output voltage is fixed or controllable.

14. A bias circuit connectable, during operation, to a power amplifier comprising a plurality of MOSFET devices to produce a power amplifier AC output voltage at a power amplifier output, the bias circuit comprising:
   a rectifier, the rectifier having a rectifier DC voltage output and rectifying an AC voltage originated from the power amplifier AC output voltage to a DC voltage at the rectifier DC voltage output, the DC voltage being input, during operation, to one or more gate terminals of the MOSFET devices of the power amplifier,
   wherein an AC voltage divider is connected between the amplifier output and the rectifier, the AC voltage divider comprising an arrangement in series of a voltage dividing capacitor and a plurality of resistors.

15. The bias circuit of claim 14, further comprising a DC voltage divider connected with the rectifier DC voltage output and the one or more gate terminals of the MOSFET devices, the DC voltage divider comprising a plurality of resistive arrangements.

16. The bias circuit of claim 15, wherein the number of the resistive arrangements depends on the number of the MOSFET devices.

17. The bias circuit of claim 14, wherein the rectifier comprises a diode with a series capacitance.

18. The bias circuit of claim 17, wherein the diode comprises two MOSFET devices connected in series, each MOSFET device comprising a gate terminal and a source terminal connected to each other.

19. The bias circuit of claim 14, further comprising a bias source providing one or more pre-bias voltages.

20. The bias circuit of claim 19, wherein each of the one or more pre-bias voltages is routed to a respective gate of the MOSFET devices.

21. The bias circuit of claim 19, wherein the bias source provides a fixed or controllable DC output voltage.

22. The bias circuit of claim 14, further comprising a plurality of voltage balancing capacitors, each voltage balancing capacitor connecting a respective gate of the MOSFET devices to a reference node.

23. The bias circuit of claim 22, wherein a ratio of a capacitance of each voltage balancing capacitor of the plurality of voltage balancing capacitors to a capacitance of a gate-source capacitor of a respective MOSFET device is chosen such that respective gates of the MOSFET devices experience same voltage levels.

24. The bias circuit of claim 14, wherein the bias circuit is connected to the power amplifier.

25. The bias circuit of claim 24, wherein the power amplifier is a class-E amplifier, the class-E amplifier comprising a load network.

26. The bias circuit of claim 25, further comprising a bias circuit capacitor connecting the power amplifier output to the rectifier.

27. The bias circuit of claim 26 wherein during operation, a combination of the bias circuit capacitor and the load network provides resonance condition when the MOSFET devices are in OFF state.

28. A bias circuit connectable, during operation, to a power amplifier comprising a plurality of MOSFET devices to produce a power amplifier AC output voltage at a power amplifier output, the bias circuit comprising:
   one or more rectifiers to rectify the power amplifier AC output voltage to generate one or more bias outputs; and
   one or more AC voltage dividers each connected between the amplifier output and a respective rectifier, wherein each AC voltage divider comprises an arrangement in series of a bias capacitor with a plurality of resistors.

29. The bias circuit of claim 28, wherein each rectifier comprises a diode in series with a filter, the filter comprising a resistor in parallel with a capacitance.

30. The bias circuit of claim 29, wherein each diode comprises two MOSFET devices connected in a series configuration, each MOSFET device comprising a gate terminal and a source terminal connected to each other.

31. The bias circuit of claim 28, further comprising a second bias source providing one or more pre-bias voltages.

32. The bias circuit of claim 31, wherein the bias source provides a fixed or controllable DC output voltage.

33. The bias circuit of claim 28, further comprising a plurality of voltage balancing capacitors, each voltage balancing capacitor connecting a respective gate of the MOSFET devices to a reference node.

34. The bias circuit of claim 33, wherein a ratio of a capacitance of each voltage balancing capacitor of the plurality of voltage balancing capacitors to a capacitance of a gate-source capacitor of a respective MOSFET device is chosen such that respective gates of the MOSFET devices experience same voltage levels.

35. The bias circuit of claim 28, wherein the bias circuit is connected to the power amplifier.

36. The bias circuit of claim 35, wherein the power amplifier is a class-E amplifier, the class-E amplifier comprising a load network.

37. The bias circuit of claim 36, further comprising a bias circuit capacitor connecting the power amplifier output to the rectifier.

38. The bias circuit of claim 37 wherein during operation, a combination of the bias circuit capacitor and the load network provides a resonance condition when the MOSFET devices are in OFF state.

39. An RF power amplifier for amplifying an input signal comprising:
- an amplifier input;
- an amplifier output;
- a reference node;
- a first inductor adapted to connect the amplifier output to a power supply;
- a plurality of devices arranged in a cascode configuration between the amplifier output and the reference node;
- an output capacitor connected between the amplifier output and the reference node;
- an output resonant circuit comprising a second inductor connected in series with a capacitor, the output resonant circuit being connected at one end to the amplifier output and connectable at another end to a load;
- a bias circuit comprising:
  - an RF voltage divider having an RF voltage divider output, the RF voltage divider being connected with the amplifier output on one side and with a shunt capacitor on another side, the shunt capacitor connecting the RF voltage divider to the reference node;
  - a rectifier circuit having a rectifier circuit output, the rectifier circuit being connected with the RF voltage divider output on one side and with the reference node on another side;
  - a DC voltage divider comprising a DC voltage divider first end, a DC voltage divider second end and two or more DC voltage divider outputs, wherein the DC voltage divider first end is connected to the rectifier circuit output and the DC voltage divider second end is connected to the reference node.

40. The RF power amplifier of claim 39, wherein the plurality of amplifying devices are a plurality of MOSFET devices each comprising a MOSFET device gate.

41. The RF power amplifier of claim 40, wherein each of the two or more voltage divider outputs is connected to a respective MOSFET device gate through a series resistor.

42. The RF power amplifier of claim 40, wherein each MOSFET device gate is connected with the reference node through a voltage balancing capacitor.

43. The RF power amplifier of claim 39, wherein the RF voltage divider comprises an arrangement in-series of one or more resistors and one or more capacitors.

44. The RF power amplifier of claim 39, wherein the rectifier circuit comprises a diode in series with a capacitor.

45. The RF power amplifier of claim 39, wherein the DC voltage divider comprises two or more resistors connected in series.

46. The RF power amplifier of claim 45, wherein the diode comprises two MOSFET devices connected in a series configuration, wherein each MOSFET device has a gate terminal and a drain terminal connected to each other.

47. The RF power amplifier of claim 39, wherein the DC voltage divider second end is connected to a bias source having a bias source DC output voltage, the bias source providing one or more pre-bias voltages to the amplifying devices.

48. The RF power amplifier of claim 47, wherein the bias source provides a fixed or controllable DC output voltage.

* * * * *